(12) United States Patent
Wan

(10) Patent No.: US 10,141,366 B2
(45) Date of Patent: Nov. 27, 2018

(54) STACKED SEMICONDUCTOR CHIP RGBZ SENSOR

(71) Applicant: Google LLC, Mountain View, CA (US)

(72) Inventor: Chung Chun Wan, Fremont, CA (US)

(73) Assignee: Google Inc., Mountain View, CA (US)

( * ) Notice: Subject to any disclaimer, the term of this patent is extended or adjusted under 35 U.S.C. 154(b) by 0 days.

(21) Appl. No.: 15/693,948

(22) Filed: Sep. 1, 2017

(65) Prior Publication Data

US 2017/0373114 A1    Dec. 28, 2017

Related U.S. Application Data

(63) Continuation of application No. 15/693,544, filed on Sep. 1, 2017, which is a continuation of application
(Continued)

(51) Int. Cl.
*G01J 5/20* (2006.01)
*H01L 27/146* (2006.01)
(Continued)

(52) U.S. Cl.
CPC ........ *H01L 27/14652* (2013.01); *G01S 17/08* (2013.01); *G06T 7/50* (2017.01); *H01L 25/043* (2013.01); *H01L 27/14627* (2013.01); *H01L 27/14629* (2013.01); *H01L 27/14634* (2013.01); *H01L 27/14636* (2013.01); *H01L 27/14645* (2013.01); *H01L 27/14649* (2013.01); *H04N 5/332* (2013.01); *H04N 5/378* (2013.01);
(Continued)

(58) Field of Classification Search
CPC ........ H01L 27/14636; H01L 27/14634; H01L 27/14645; H01L 27/14649; H01L 27/14629; H01L 27/1464; H01L 25/043; H01L 27/14647; H01L 27/14652; H01L 27/14625; H01L 27/14632; H01L 27/307; H01L 27/14643; H01L 27/1469; G01S 17/08; G06T 7/50
USPC ...................................................... 250/338.4
See application file for complete search history.

(56) References Cited

U.S. PATENT DOCUMENTS 7,154,157 B2 * 12/2006 Bradski ............. H01L 27/14647
257/440
7,274,393 B2    9/2007 Acharya
(Continued)

FOREIGN PATENT DOCUMENTS

CN    101577287    11/2009
EP    2879181    6/2015
WO    WO 2014/017314    1/2014

OTHER PUBLICATIONS

Enquist, Paul, "Direct Bond Interconnect Slashes Large-Die SOC Manufacturing Costs", FSA Forum, Fall 2006, 3 pages.
(Continued)

*Primary Examiner* — Taeho Jo
(74) *Attorney, Agent, or Firm* — Fish & Richardson P.C.

(57) ABSTRACT

An apparatus is described that includes a first semiconductor chip having a first pixel array. The first pixel array has visible light sensitive pixels. The apparatus includes a second semiconductor chip having a second pixel array. The first semiconductor chip is stacked on the second semiconductor chip such that the second pixel array resides beneath the first pixel array. The second pixel array has IR light sensitive pixels for time-of-flight based depth detection.

20 Claims, 17 Drawing Sheets

Related U.S. Application Data

No. 15/360,906, filed on Nov. 23, 2016, now Pat. No. 9,876,050, which is a continuation of application No. 14/579,882, filed on Dec. 22, 2014, now Pat. No. 9,508,681.

(51) Int. Cl.

| | |
|---|---|
| *H01L 25/04* | (2014.01) |
| *H04N 5/33* | (2006.01) |
| *H04N 5/3745* | (2011.01) |
| *H04N 5/378* | (2011.01) |
| *H04N 9/04* | (2006.01) |
| *G01S 17/08* | (2006.01) |
| *G06T 7/50* | (2017.01) |

(52) U.S. Cl.
CPC ......... *H04N 5/37455* (2013.01); *H04N 9/045* (2013.01); *H01L 2924/00* (2013.01); *H01L 2924/0002* (2013.01)

(56) References Cited

U.S. PATENT DOCUMENTS

| | | | |
|---|---|---|---|
| 7,375,803 B1 | 5/2008 | Bamji | |
| 7,781,716 B2 | 8/2010 | Anderson et al. | |
| 7,936,038 B2 | 5/2011 | Jeonq et al. | |
| 7,990,636 B2 | 8/2011 | Park et al. | |
| 8,027,107 B2 | 9/2011 | Hwang et al. | |
| 8,116,018 B2 | 2/2012 | Park et al. | |
| 8,139,141 B2 | 3/2012 | Bamii et al. | |
| 8,139,142 B2 | 3/2012 | Bamji et al. | |
| 8,159,762 B2 | 4/2012 | Lim et al. | |
| 8,218,016 B2 | 7/2012 | Park et al. | |
| 8,274,051 B1* | 9/2012 | Aswell | G01J 3/513 250/338.4 |
| 8,436,308 B2* | 5/2013 | Choe | H01L 27/14652 250/339.05 |
| 8,542,348 B2 | 9/2013 | Hardeqqer et al. | |
| 8,698,084 B2* | 4/2014 | Jiang | H01L 27/14609 250/339.05 |
| 8,809,784 B2* | 8/2014 | Gooch | H01L 27/14618 250/338.1 |
| 9,111,830 B1* | 8/2015 | Dixon | H01L 27/14625 |
| 9,111,832 B2* | 8/2015 | Lin | H01L 27/14629 |
| 9,182,490 B2* | 11/2015 | Velichko | H01L 27/14875 |
| 9,184,194 B2* | 11/2015 | Cellek | H01L 31/1013 |
| 9,184,200 B2* | 11/2015 | Lin | H01L 27/14629 |
| 9,190,433 B2* | 11/2015 | Chua | H01L 27/1443 |
| 9,214,492 B2 | 12/2015 | Van Der Tempel et al. | |
| 9,429,723 B2* | 8/2016 | Wober | G02B 6/4204 |
| 2003/0063185 A1 | 4/2003 | Bell | |
| 2004/0125222 A1* | 7/2004 | Bradski | H01L 27/14647 348/272 |
| 2009/0278048 A1* | 11/2009 | Choe | H01L 27/14647 250/339.05 |
| 2009/0294812 A1* | 12/2009 | Gambino | H01L 27/14647 257/292 |
| 2010/0178018 A1* | 7/2010 | Augusto | G02B 6/12 385/131 |
| 2010/0295947 A1 | 11/2010 | Boulanqer | |
| 2011/0001205 A1 | 1/2011 | Sul et al. | |
| 2011/0058038 A1* | 3/2011 | Twede | H04N 5/332 348/148 |
| 2011/0084314 A1* | 4/2011 | Or-Bach | H01L 21/76898 257/209 |
| 2011/0095188 A1 | 4/2011 | Qian et al. | |
| 2011/0116078 A1 | 5/2011 | Cho et al. | |
| 2011/0194007 A1 | 8/2011 | Kim et al. | |
| 2011/0202310 A1* | 8/2011 | Min | G01S 17/10 702/166 |
| 2012/0028436 A1* | 2/2012 | Or-Bach | G11C 17/14 438/401 |
| 2012/0038904 A1* | 2/2012 | Fossum | H01L 27/14603 356/5.09 |
| 2012/0097946 A1* | 4/2012 | Gidon | H01L 27/14636 257/53 |
| 2012/0189293 A1* | 7/2012 | Cao | G03B 9/02 396/333 |
| 2012/0241618 A1 | 9/2012 | Hsu et al. | |
| 2012/0249740 A1* | 10/2012 | Lee | H04N 13/254 348/46 |
| 2012/0268566 A1* | 10/2012 | Kim | H04N 5/3696 348/46 |
| 2013/0026859 A1 | 1/2013 | Bae et al. | |
| 2013/0087682 A1* | 4/2013 | Nomura | C09B 23/105 250/206 |
| 2013/0134470 A1 | 5/2013 | Shin et al. | |
| 2013/0221470 A1* | 8/2013 | Kinsman | H01L 27/14618 257/434 |
| 2013/0222543 A1* | 8/2013 | Bae | G01S 17/89 348/46 |
| 2014/0015932 A1* | 1/2014 | Kim | H01L 27/14621 348/46 |
| 2014/0098192 A1* | 4/2014 | Park | G01S 17/08 348/46 |
| 2014/0176663 A1 | 6/2014 | Cutler et al. | |
| 2014/0217474 A1 | 8/2014 | Lee et al. | |
| 2014/0225173 A1* | 8/2014 | Kim | H01L 27/14612 257/292 |
| 2014/0240492 A1 | 8/2014 | Lee | |
| 2014/0252437 A1* | 9/2014 | Oh | H01L 27/14643 257/292 |
| 2014/0347442 A1 | 11/2014 | Wang et al. | |
| 2015/0001664 A1* | 1/2015 | Van Der Tempel | H01L 27/14612 257/432 |
| 2015/0022869 A1* | 1/2015 | Shi | H04N 1/40012 358/482 |
| 2015/0054962 A1* | 2/2015 | Borthakur | H04N 5/332 348/164 |
| 2015/0129747 A1* | 5/2015 | Petilli | H01L 27/14627 250/208.1 |
| 2015/0287766 A1* | 10/2015 | Kim | H01L 27/307 250/208.1 |
| 2015/0378232 A1* | 12/2015 | Snow | E06B 9/24 359/275 |
| 2016/0165213 A1* | 6/2016 | Lee | G01S 17/89 348/46 |
| 2016/0245697 A1* | 8/2016 | Shibayama | G01J 3/26 |
| 2017/0141152 A1* | 5/2017 | Petilli | H01L 27/14627 |

OTHER PUBLICATIONS

Baron, Jerome, "Backside Illumination, Wafer-Scale Opticws Drive 2X-5X Jump in CMOS Image Sensor Performance", Solid State Technology, http://electroig.com/blog/2010/back-side-illumination, May 24, 2010, pp. 1-6.

Holly, Russell, Pelican Imaging and Why 16 Tiny Cameras Are Better Than One Big One, GeeK, Sep. 24, 2013, http://www.geek.com/mobile/pelican-mobile-camera-array-hopes-to-reinvent-the-smartphone-camera-1569516/, pp. 1-4.

PCT/US2015/057812—International Search Report and Written Opinion, dated Apr. 22, 2016, 10 pages.

'tech.nikkeibp.co.jp' [online] "[ISSCC] Samsung's CMOS Sensor Takes Range, RBG Images at Same Time," Tomonori Shindo, Nikkei Electronics, Feb. 25, 2012, Retrieved from Internet: URL<http://tech.nikkeibp.co.jp/dm/english/NEWS_EN/20120225/206010/> 2 pages.

'techcrunch.com' [online] "New Samsung Sensor Captures Both Light and Depth Data," Devin Coldwey, Mar. 1, 2012, Retrieved from Internet: URL< https://techcrunch.com/2012/02/29/new-samsung-sensor-captures-both-light-and-depth-data/> 2 pages.

'www.123anfang.com' [online] "Starlight Video Surveillance Camera Dedicated Sony ISX017 Integrated Image Sensor," Guardian Security, Aug. 5, 2016, Retrieved from Internet: URL<www.123AnFang.com> 5 pages.

'www.enbedded-vision.com' [online] "Time of Flight: Samsung's New RGB Image Sensor Also has Depth Sight," Mar. 1, 2012,

(56) References Cited

OTHER PUBLICATIONS

Retrieved from Internet: URL< https://www.embedded-vision.com/news/2012/03/01/time-flight-samsungs-new-rgb-image-sensor-also-has-depth-sight> 2 pages.

'www.petapixel.com' [online] Sony Shows Off a New Ultra-Sensitive CMOS Sensor Called 'STARVIS' Michael Zhang, Oct. 26, 2015, [retrieved on Mar. 28, 2018] Retrieved from Internet: URL<https://petapixel.com/2015/10/26/sony-shows-off-a-new-ultra-sensitive-cmos-sensor-called-starvis/> 14 pages.

'www.ptgrey.com' [online] "Exmor R / STARVIS," Available on or before Jul. 13, 2017 via the Wayback Internet Archive [retrieved on Mar. 28, 2018] Retrieved from Internet: URL< https://www.ptgrey.com/exmor-r-starvis> 5 pages.

'www.sunnic.com' [online] "Sony Develops RGB+IR Image Sensor Solution," Oct. 12, 2016, [retrieved on Apr. 4, 2018] Retrieved from Internet: URL<http://www.sunnic.com.tw/english/05_news/02_detail.php?NID=119> 2 pages.

Extended European Search Report issued in European Application No. 15873895.5, dated Jun. 7, 2018, 10 pages.

Kim et al. "A 1.5Mpixel Rgbz Cmos Image Sensor for Simultaneous Color and Range Image Capture," IEEE International Solid-State Circuits Conference, Session 22.7, 978-1-4673-0377-4, Feb. 2012, 3 pages.

Office Action issued in Chinese Application No. 201580035044.0, dated Mar. 9, 2018, 10 pages (English translation).

Sony Brochure "CMOS Image Sensor," 2015 New Products, 5 pages.

Sony. "Preliminary ISX017-0AWR-C: STARVIS," Revision 0.2, Retrieved from Internet: URL<http://www.google.com/url?sa=t&rct=j&q=&esrc=s&source=web&cd=1&ved=0ahUKEwjvrqjFpdPaAhVSZKwKHccGDBIQFggpMAA&url=http%3A%2F%2Fe2e.ti.com%2Fcfs-file%2F_key%2Fcommunityserver-discussions-components-files%2F26%2FISX017_2D00_0AWR_2D00_C_5F00_E_5F00_TechnicalDatasheet_5F00_Rev0- 2.pdf&usg=AOvVaw1W_J4Zbiskzwyt-1NYLtp5 > 84 pages.

Extended European Search Report issued in European Application No. 18159573.7, dated Oct. 9, 2018, 9 pages.

* cited by examiner

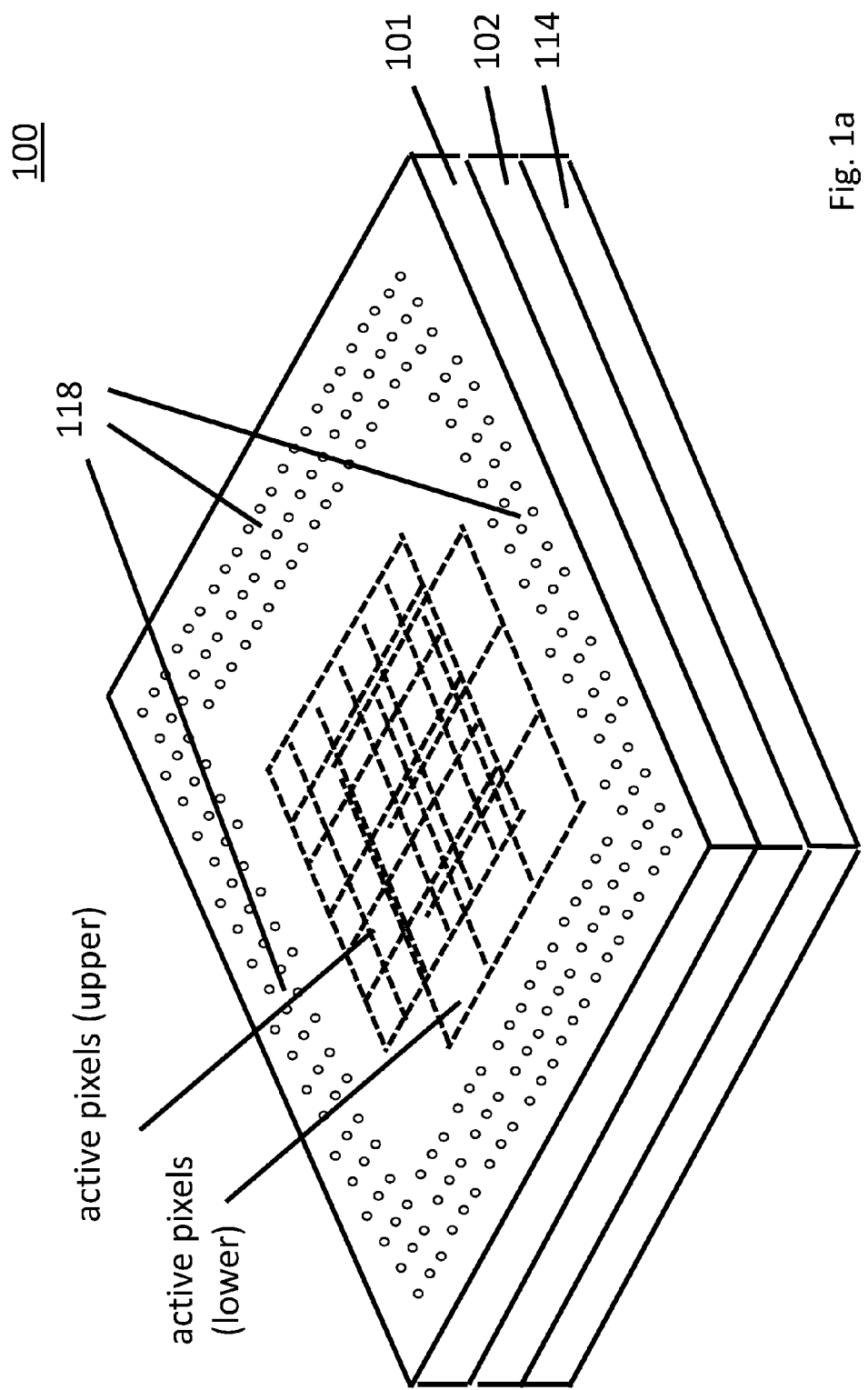

Circuitry of upper pixel array: 0

Circuitry of lower pixel array: 0

Circuitry of lower substrate ( = semiconductor chip): upper and lower pixel array circuitry, upper and lower pixel array ADC circuitry, upper and lower pixel array timing and control circuitry

Fig. 4a

Circuitry of upper pixel array: upper pixel array circuitry, upper pixel array ADC circuitry, upper pixel array timing and control circuitry Circuitry of lower pixel array: lower pixel array circuitry lower pixel array ADC circuitry, lower pixel array timing and control circuitry Circuitry of lower substrate ( = package substrate): 0

Fig. 4b

Circuitry of upper pixel array: upper pixel array circuitry;

Circuitry of lower pixel array: lower pixel array circuitry;

Circuitry of lower substrate ( = semiconductor chip): upper and lower pixel array ADC circuitry, upper and lower pixel array timing and control circuitry

Fig. 4c

Circuitry of upper pixel array: upper pixel array circuitry;

Circuitry of lower pixel array: lower pixel array circuitry; upper and lower pixel array ADC circuitry, upper and lower pixel array timing and control circuitry Circuitry of lower substrate ( = package substrate): 0

Fig. 4d

STACKED SEMICONDUCTOR CHIP RGBZ SENSOR

RELATED CASES

This application is a continuation of and claims the benefit of U.S. patent application Ser. No. 15/693,544, titled "STACKED SEMICONDUCTOR CHIP RGBZ SENSOR", filed Sep. 1, 2017, which is a continuation of and claims the benefit of U.S. patent application Ser. No. 15/360,906, titled "STACKED SEMICONDUCTOR CHIP RGBZ SENSOR", filed Nov. 23, 2016, which is a continuation of and claims the benefit of U.S. patent application Ser. No. 14/579,882, titled "STACKED SEMICONDUCTOR CHIP RGBZ SENSOR", filed Dec. 22, 2014, which is incorporated by reference in its entirety.

FIELD OF INVENTION

The field of invention pertains generally to the electronic arts, and, more specifically, to a stacked semiconductor chip RGBZ sensor.

BACKGROUND

Many existing computing systems include one or more traditional image capturing cameras as an integrated peripheral device. A current trend is to enhance computing system imaging capability by integrating depth capturing into its imaging components. Depth capturing may be used, for example, to perform various intelligent object recognition functions such as facial recognition (e.g., for secure system un-lock) or hand gesture recognition (e.g., for touchless user interface functions).

One depth information capturing approach, referred to as "time-of-flight" imaging, emits light from a system onto an object and measures, for each of multiple pixels of an image sensor, the time between the emission of the light and the reception of its reflected image upon the sensor. The image produced by the time of flight pixels corresponds to a three-dimensional profile of the object as characterized by a unique depth measurement (z) at each of the different (x,y) pixel locations.

As many computing systems with imaging capability are mobile in nature (e.g., laptop computers, tablet computers, smartphones, etc.), the integration of time-of-flight operation along with traditional image capture presents a number of design challenges such as cost challenges and packaging challenges.

SUMMARY

An apparatus is described that includes a first semiconductor chip having a first pixel array. The first pixel array has visible light sensitive pixels. The apparatus includes a second semiconductor chip having a second pixel array. The first semiconductor chip is stacked on the second semiconductor chip such that the second pixel array resides beneath the first pixel array. The second pixel array has IR light sensitive pixels for time-of-flight based depth detection.

An apparatus is described that includes means for receiving visible light and IR light at a surface of a first pixel array. The apparatus also includes means for sensing the visible light but not the IR light with the first pixel array, where, the IR light passes through the first pixel array. The apparatus also includes sensing the IR light with a second pixel array located beneath the first pixel array.

FIGURES

The following description and accompanying drawings are used to illustrate embodiments of the invention. In the drawings:

FIGS. 1a and 1b show an embodiment of a stacked semiconductor chip RGBZ sensor;

FIGS. 4a through 4d show different image sensor circuitry distributions;

DETAILED DESCRIPTION

An "RGBZ" image sensor is an appealing solution for achieving both traditional image capture and time of flight depth profiling from within a same camera package. An RGBZ image sensor is an image sensor that includes different kinds of pixels, some of which are sensitive to visible light (the RGB pixels) and others of which are used to measure depth information (the time-of-flight or "Z" pixels).

In a common implementation, time of flight pixels are designed to be sensitive to IR light because, as mentioned above, IR light is used for the time-of-flight measurement so that the time-of-flight measurement does not interfere with the traditional imaging functions of the RGB pixels. The time-of-flight pixels additionally have special associated clocking and/or timing circuitry to measure the time at which light has been received at the pixel. Because the time-of-flight pixels are sensitive to IR light, however, they may also be conceivably used (e.g., in a second mode) as just IR pixels and not time-of-flight pixels (i.e., IR information is captured but a time of flight measurement is not made).

Figure 1B:
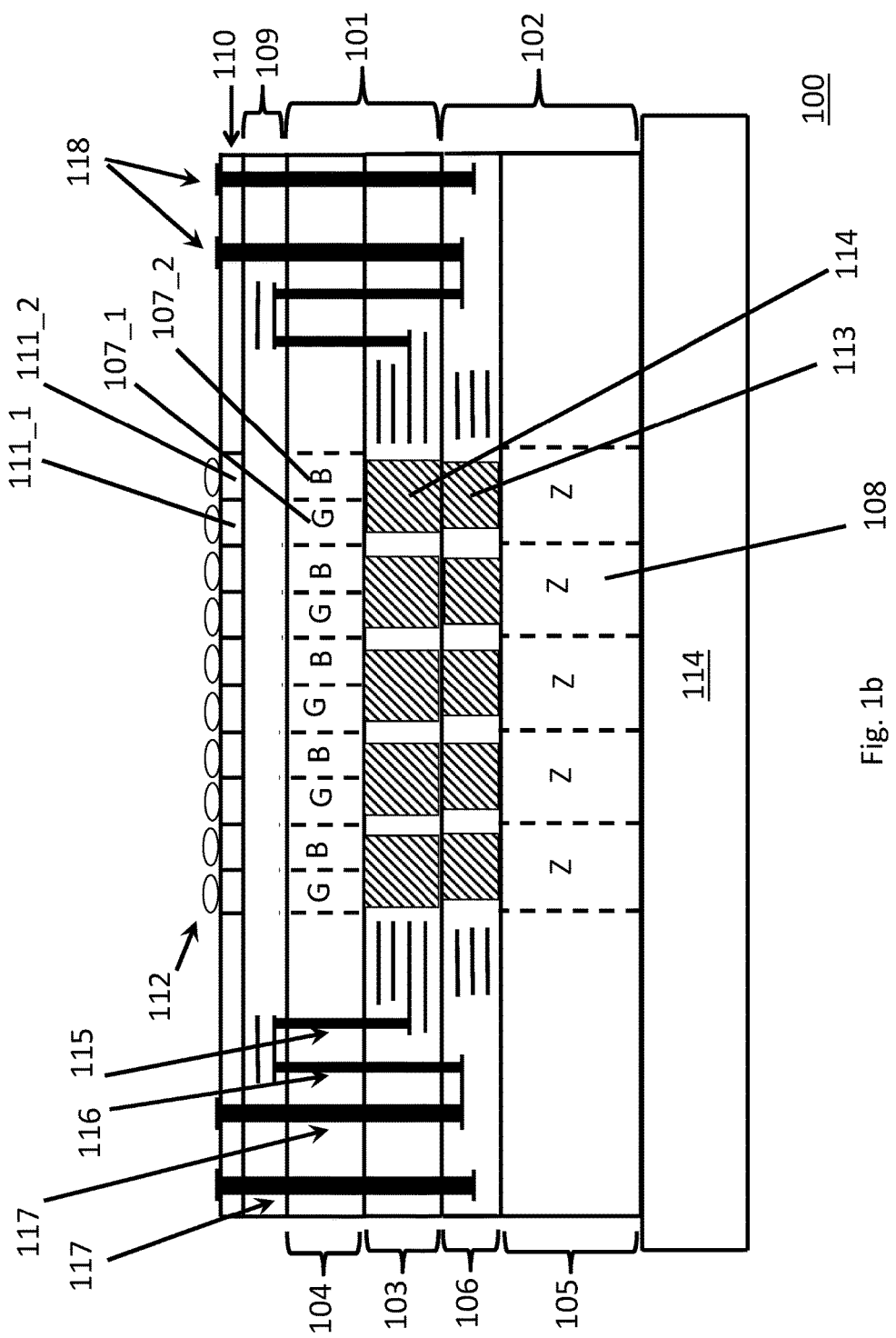

Integrating both RGB pixels and Z pixels into a same package should reduce both size and cost as compared to solutions in which the RGB pixels and Z pixels are contained in separate packages. FIGS. 1a and 1b show a "stacked" RGBZ image sensor 100 in which a first type of pixel array 101 (e.g., an RGB pixel array) is stacked on top of a second type of pixel array 102 (e.g., an IR or Z pixel array). Here, the stacked structure 100 includes functional pixels of a first type 107 (RGB), as opposed to mere filters, stacked on a lower layer of functional pixels of a second type 108 (Z). As will be discussed in more detail further below, in operation, the upper pixel array 101 is implemented as a backside illumination pixel array and the lower pixel array 102 is implemented as a frontside illumination pixel array.

As observed in the embodiment of FIGS. 1a and 1b, backside interconnect metallization layering 109, an RGB filtering layer 110 and a micro-lens array 112 reside on the backside of the semiconductor die 104 of the upper pixel array 101. The backside metallization layering 109 helps support chip-to-chip vias 116 between the pair of pixel arrays 101, 102. The RGB filtering layer 110 includes different colored filters 111_1, 111_2 to define the RGB pixels of the upper pixel array 101. The micro lens array 112 is formed on an upper surface of the overall structure 100 along with wire bond pads 118. Wire bonds formed on the wire bond pads 116 may land on a package substrate. In some embodiments lower substrate 114 corresponds to the package substrate while in other embodiments lower substrate 114 corresponds to another semiconductor chip which is mounted on the package substrate (in the later embodiments the package substrate is not shown in FIG. 1b).

The upper pixel array 101 also includes frontside metallization layering 103 to form the transistor components (such as gate and source/drain electrodes) and corresponding layer(s) of interconnect that together form the circuitry that is integrated on the upper pixel array 101. Notably, the upper pixel array 101 includes through substrate vias 115 that extend through the semiconductor substrate 104 of the upper pixel array 101 to connect nodes of the metallization layering 103 to nodes of metallization layer 109.

The lower pixel array 102 includes frontside interconnect metallization layering 106 that faces the frontside interconnect metallization 103 of the upper pixel array 101. Frontside metallization layering 106 is used to form the transistor components (such as gate and source/drain electrodes) and corresponding layer(s) of interconnect that together form the circuitry that is integrated on the lower pixel array 102. The frontside metallization layer 106 of the lower pixel array 102 also include nodes that are connected to vias 116 that connect to nodes of the backside metallization layering 109 of the upper pixel array 101. These vias 116, like vias 115, are also implemented as through-substrate-vias of the upper pixel array 101.

The frontside metallization layer 106 of the lower pixel array 102 further includes additional nodes that are connected to vias 117 that connect to bond pads 118. Like vias 115 and 116, vias 117 are also implemented as through-substrate-vias of the upper pixel array 101. Although FIG. 1b indicates that all input/output signaling to/from upper pixel array 101 must pass through the frontside metallization layering 106 of the lower pixel array 102, in various embodiments backside metallization layering 109 of the upper pixel array 101 may support vias that directly connect to bond pads 118 thereby permitting signals to pass between a bond pad and the upper pixel array 101 without having to transvers through the metallization layering 106 of the lower pixel array 102.

Note that FIG. 1b shows an embodiment of a stacked RGBZ image sensor along a particular slice that shows a first horizontal axis of the RGB pixel array. If, for example, a depiction of the same structure were shown along a next horizontal axis that is closer to or farther away from the GBGB . . . axis of FIG. 1b, the visible pixels of the upper pixel array 101 would instead demonstrate, e.g., a GRGR . . . pattern instead of an GBGB . . . pattern. Note also that in the embodiment of FIG. 1b the Z pixels 108 are larger than the RGB pixels because, e.g., silicon has a reduced sensitivity of IR light as compared to visible light and/or the Z pixels require larger well capacitance. The frontside metallization layers 103, 106 of the upper and lower pixel arrays 101, 102 may also include respective light guide structures 113, 114 to couple incident light that flows through the RGB pixels of the upper pixel array 102 into the Z pixels of the lower pixel array 102.

Figure 2:
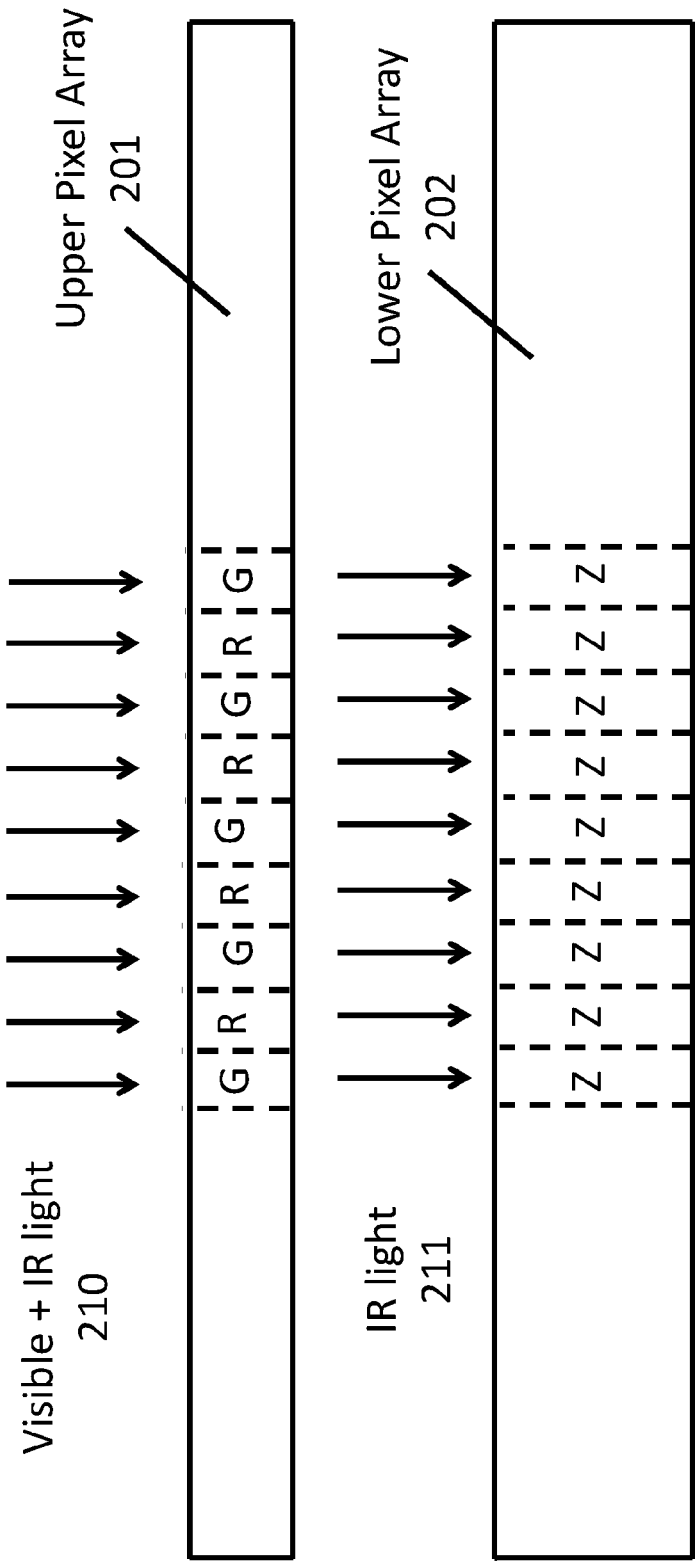
FIG. 2 shows a depiction of the operation of a stacked semiconductor chip RGBZ sensor.

FIG. 2 depicts a method of operation of the stacked pixel array structure of FIGS. 1a and 1b. As observed in FIG. 2, light consisting of visible light and IR light 210 is incident upon the (e.g., backside) surface of the upper RGB pixel array 201. As is known in the art, the RGB filter layer(s) 110 formed on the upper pixel array 201 contains individual, tile-like green 107_1, and blue 107_2 filters typically arranged in a pattern such as a Bayer pattern. Each individual RGB filter passes not only visible light of its own specific color (e.g., red in the case of an R pixel, blue in the case of a B pixel, etc.) but also IR light. The specific color of the visible light and the IR light impinge upon the (e.g., backside) of the semiconductor substrate 104 of the upper pixel array 201. The pixels 107_1, 107_2 of the upper pixel array 201 absorb the visible light and generate a respective detection signal for their respective colors in response thereto.

Unlike the visible light which is absorbed by the upper pixel array 201, by contrast, the IR light passes through the upper pixel array 201. Here, as a general matter of physics, visible light tends to be much more strongly absorbed by a semiconductor than IR light. As such, by making the semiconductor die 104 of the upper pixel array 201 layer thin enough, the upper pixel array 201 can be made to absorb and react to the incident visible light yet, at the same time, substantially pass the incident IR light.

Ideally therefore, the IR light 211 that was incident upon the upper pixel array 201 largely passes through the upper pixel array 201 to the lower pixel array 202. In an embodiment, the semiconductor die 105 of the lower pixel array 202 is made thicker than the semiconductor die 104 of the upper pixel array 201 so that, unlike the upper pixel array 201, it absorbs the incident IR 211 light rather than passes it. As such, the pixels of the lower pixel array 202 absorb the IR light and generate a respective detection signal in response thereto. By absorbing the IR light, any circuitry beneath the lower pixel array 202 (such as if lower substrate 114 is implemented as a semiconductor chip) is not disturbed.

In various implementations the Z pixels of the lower pixel array 202 effectively perform "3D" time-of-flight depth measurements by generating charge as a function of the time between when an IR illuminator's light was flashed "on" and when the flash's reflected light is received at the lower pixel array 202. The Z pixels typically receive clock signals that each have a known phase relationship with the illuminator's clock signal. In one embodiment, there are four such clock signals (e.g., 0°, 90°, 180° and 270° quadrature arms) provided to each Z pixel of the lower pixel array.

Here, clocking a Z pixel with clocks of differing phase (e.g., through 4 sequential exposure times) will collect different amounts of charge for a same light flash. Collected charge signals from the different clocks can be combined to generate a specific time-of-flight value for the region where the nodes reside. In one implementation, such combination is made by an image signal processor (e.g., integrated on a host system such as a processor or applications processor semiconductor chip).

Note that the stacked pixel array structure of FIG. 2 naturally lends itself to simultaneously being able to detect visible images with the upper RGB pixel array 201 while detecting IR light for time of flight measurements with the lower Z pixel array 202.

FIGS. 3a through 3i show an exemplary process for manufacturing the stacked pixel array structure. As observed in FIG. 3a, the upper pixel array 301 is formed (e.g., according to a first wafer manufacturing process) with frontside metallization 303 that includes corresponding light guides 114 each formed over groups of visible light pixel regions that are commensurate in size with the Z pixels associated with the lower pixel array (e.g., a 4×4 square of RGB pixels containing a pair of R pixels, a G pixel and a B pixel).

As is known in the art frontside metallization 303 includes layers of conductive traces 303 with corresponding layers of dielectric in between formed above the semiconductor substrate 304. The electronic interconnect features typically include, for each pixel, one or more contacts to the underlying silicon (e.g., to bias the pixel and/or pick-up the pixel's optically induced electrical signal) and wiring to/from other circuits located around the periphery of the active pixel array that support the operation of the pixel array (e.g., sense amplifiers, row decoders, etc.). Transistor electrodes to implement these circuits are usually formed at the lowest metallization layer. For ease of drawing the transistor electrodes are not depicted.

Care is taken in the layout of the metallization layering 303 to run the conductive traces as much as practicable along the edges of the pixel boundaries rather than above the pixels themselves (so that the traces do not block the incident light). One or more of the metallization layers may be used to form a shielding layer above the circuitry that blocks incident light from reaching and disturbing the operation of the underlying transistors.

In an embodiment, light guides 314 are formed by etching through stacked dielectric layers residing over the corresponding groups of RGB pixels where individual light guides are to be placed. The stacked dielectric layers may correspond to the normal dielectric layers of layering 303 without any metal traces. After etching appropriately located trenches, the trenches are filled (e.g., by deposition) with a high-index of refraction material that is transparent to IR light. The filling of the light guide region with high-index material essentially forces internal reflection of IR light within the light guide and prevents crosstalk transmission of internal light to neighboring lightguides and/or neighboring pixels. Other approaches for forming the light guides include etching an "annulus" or similar structure around the periphery of the light guide feature boundary and filling the etching region with metal (to again force internal reflection within the light guide) or leaving the etched region as an air gap.

Figure 3A:
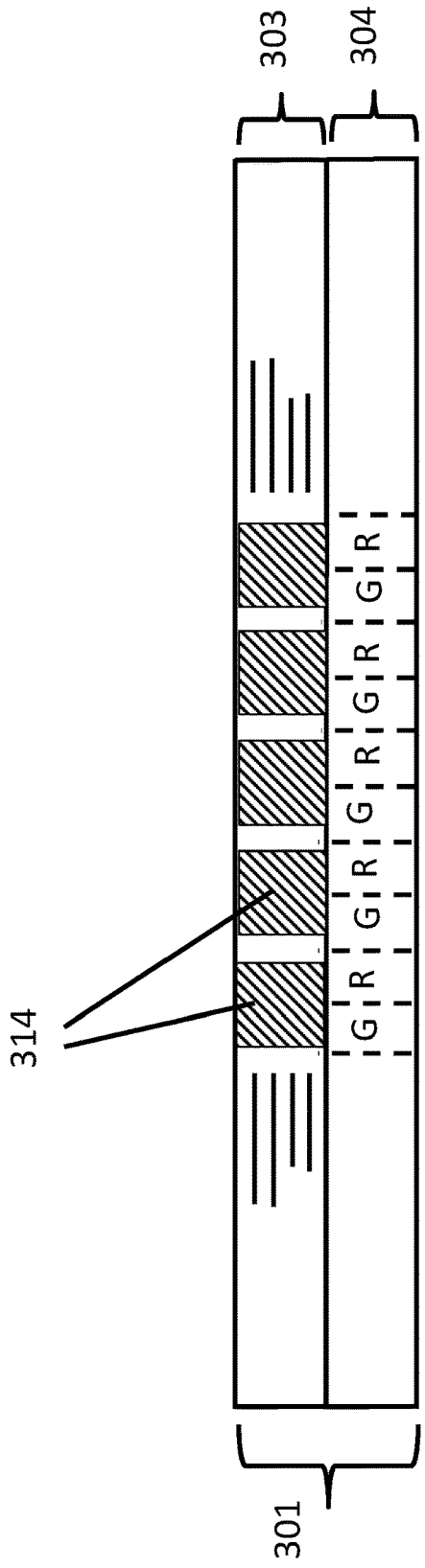
FIGS. 3a through 3i show a method of manufacturing a stacked semiconductor chip RGBZ sensor.
Figure 3B:
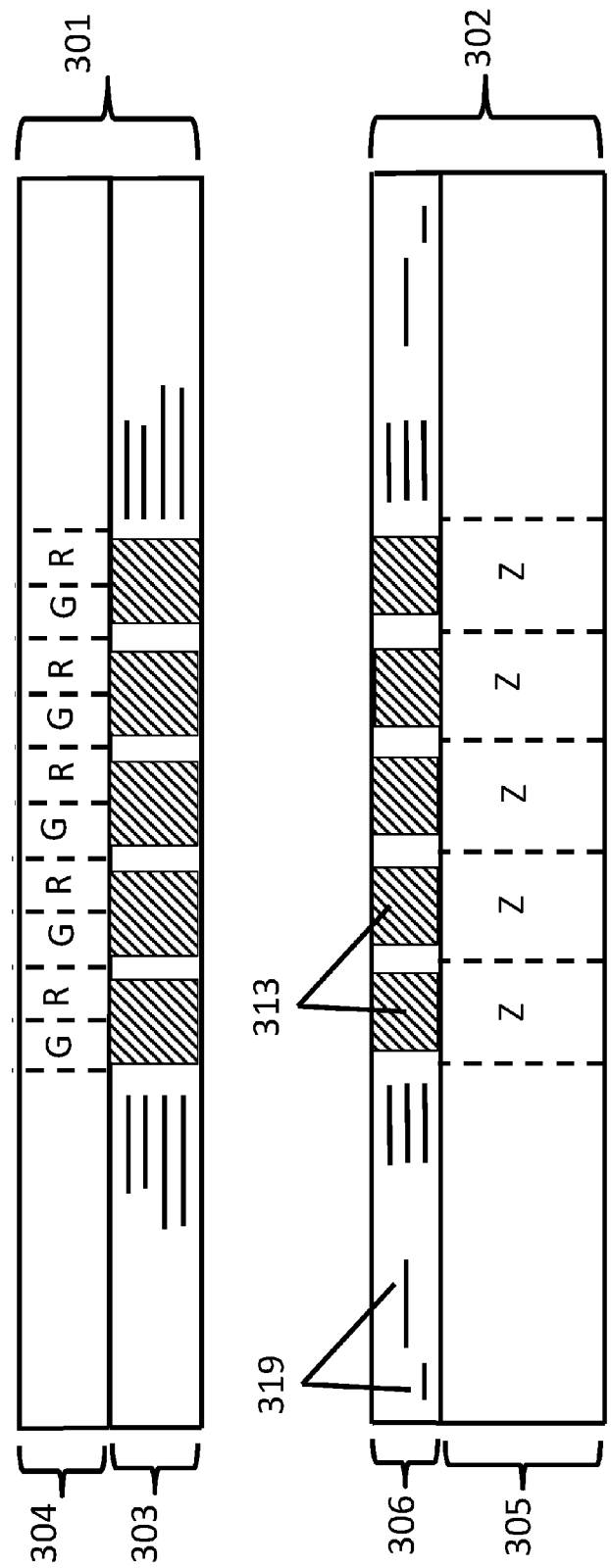

Referring to FIG. 3*b*, the lower pixel array 302 is also formed (e.g., according to a second wafer manufacturing process). The frontside metallization 306 is formed similarly to the frontside metallization 303 of the upper pixel array including the formation of individual light guides 313 above each of the Z pixel regions. The frontside metallization 306 also includes additional peripheral features 319 to support via connections to the upper pixel array or the bond pads. As observed in FIG. 3*b* note that the upper pixel array 301 is flipped with respect to its depiction in FIG. 3*a* to prepare the upper pixel array 301 for placement on the lower pixel array 302.

Figure 3C:
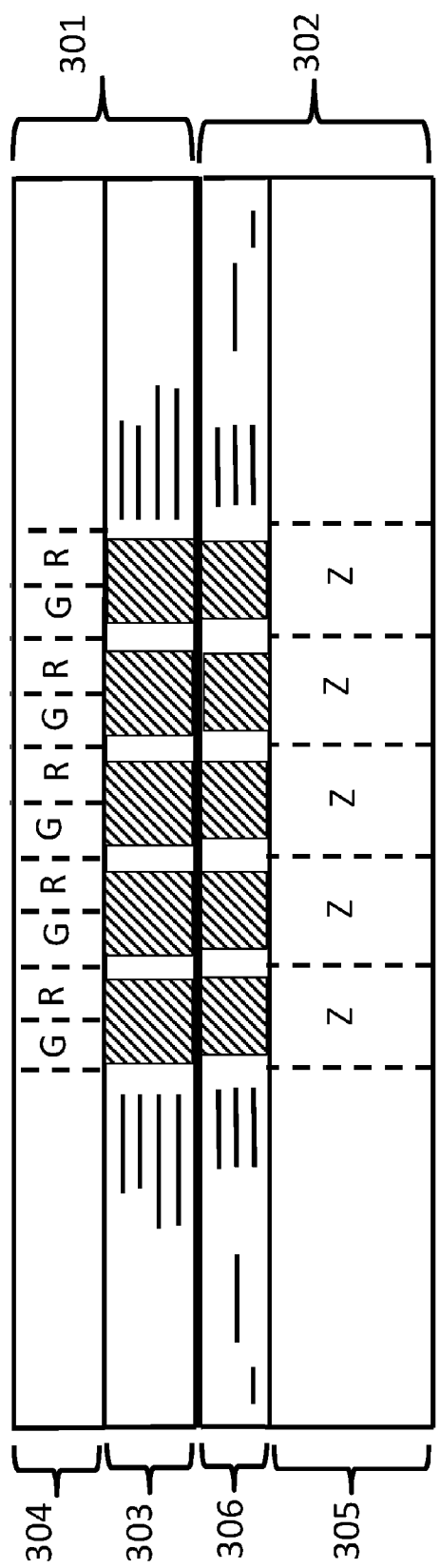

As observed in FIG. 3*c*, the inverted upper pixel array 301 is lowered onto the lower pixel array 302 according to a wafer-on-wafer semiconductor chip attach process or a die-on-die semiconductor chip attach process.

Figure 3D:
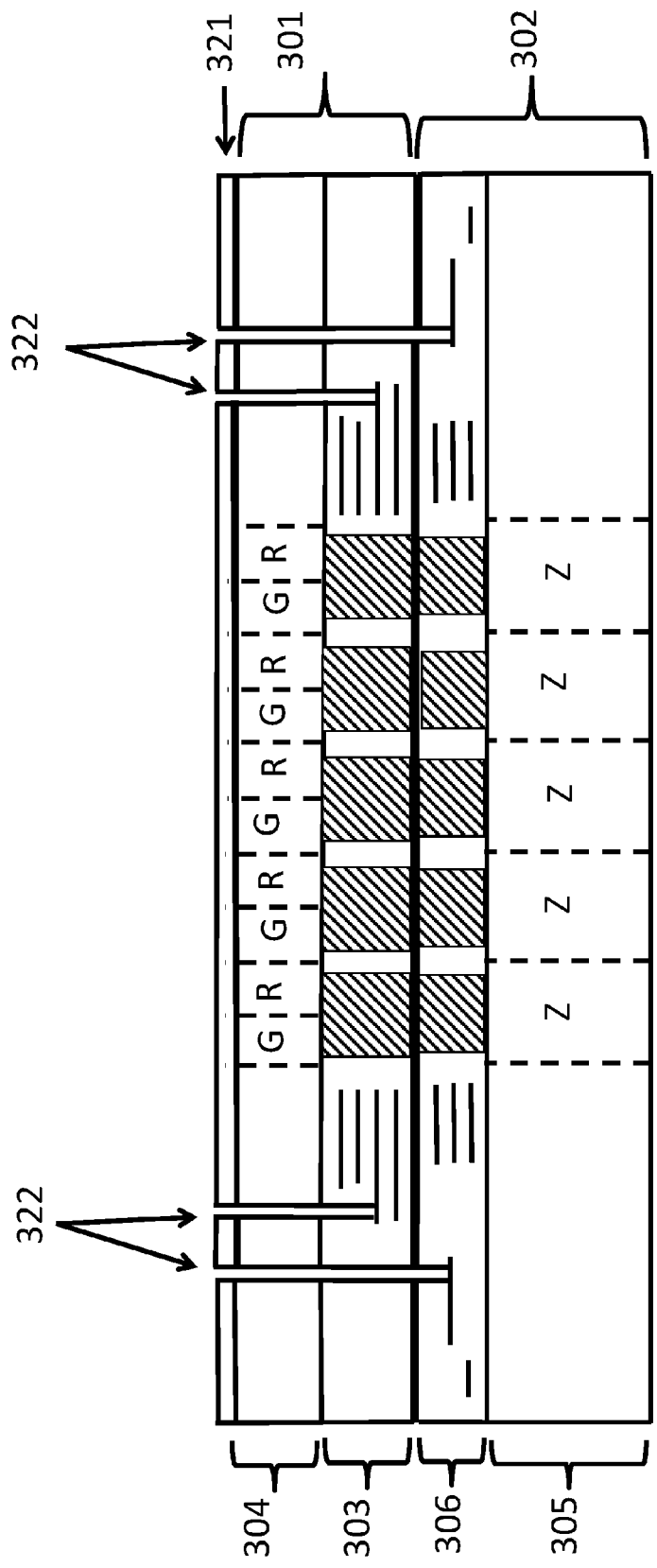

As observed in FIG. 3*d*, a lower dielectric layer 321 of backside metallization layering 109 is deposited over the backside of the upper pixel array 301. The dielectric layer 321 is then etched to form through substrate vias 322 through the semiconductor substrate 304 of the upper pixel array. The through substrate vias 322 have different depths as observed in FIG. 3*d*. A first depth extends only into the front side metallization layering 303 of the upper pixel array. A second depth extends deeper into the front side metallization layering 306 of the lower pixel array.

In an embodiment the two different etch depths are controlled by masking one another out. That is, while one of the etch depths is being etched, the regions where the other etch depth is to be etched are covered by a masking layer. As such, two different masks sequences are used to form the two etch depths. This permits different etch processes (e.g. a longer etch time for the deeper etch). The etching may be perfomed, e.g., with a reactive ion etch (RIE) or deep reactive ion etch (DRIE).

Figure 3E:
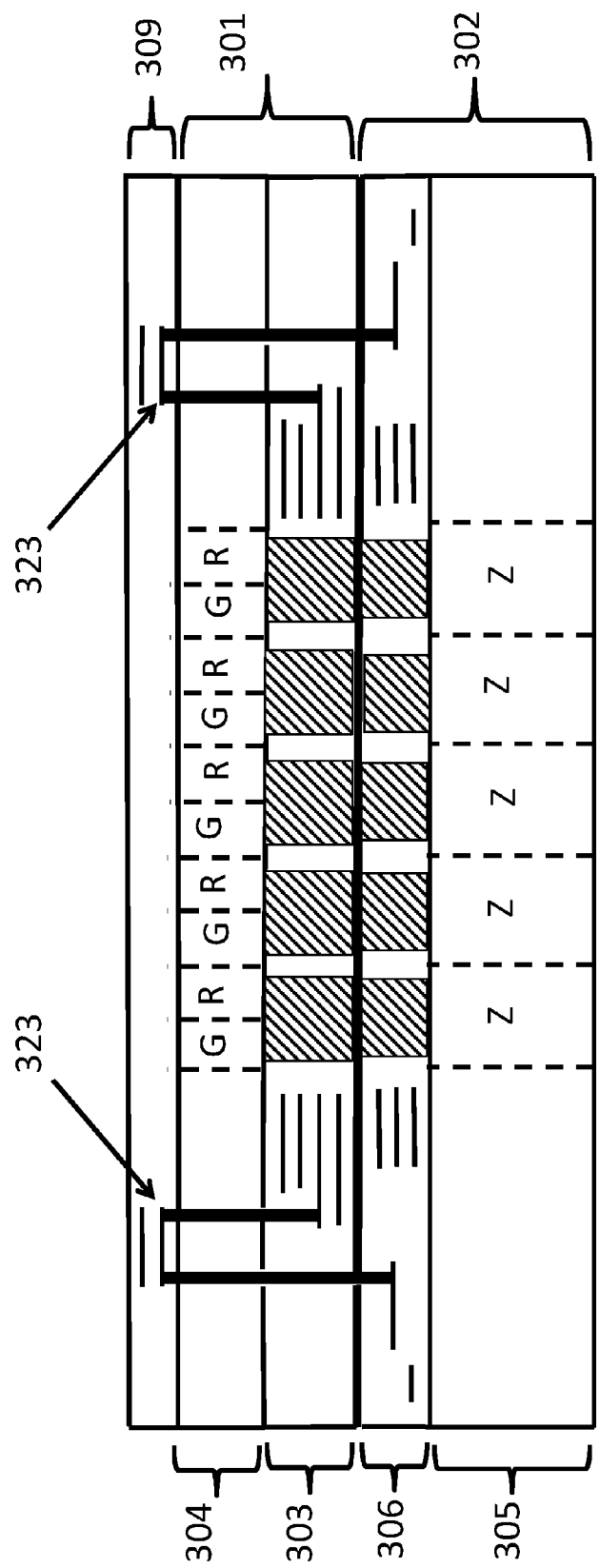

As observed in FIG. 3*e*, the backside metallization layering 309 of the upper pixel array 301 is completed including the filling of the etched regions with conductive material (e.g., metal) and the formation of features 323 that electrically connect the upper and lower pixel arrays 301, 302 to one another. In one approach, the filling of the etched regions with conducting material first includes filling the etched regions with insulating material (e.g., silicon dioxide) to form an insulating liner within the trenches and then etching the insulating material similar to the manner in which the regions were initially etched in order to form openings. Again these etches may be performed with different respective masks. After the regions are re-etched they are filled with metal.

Figure 3F:
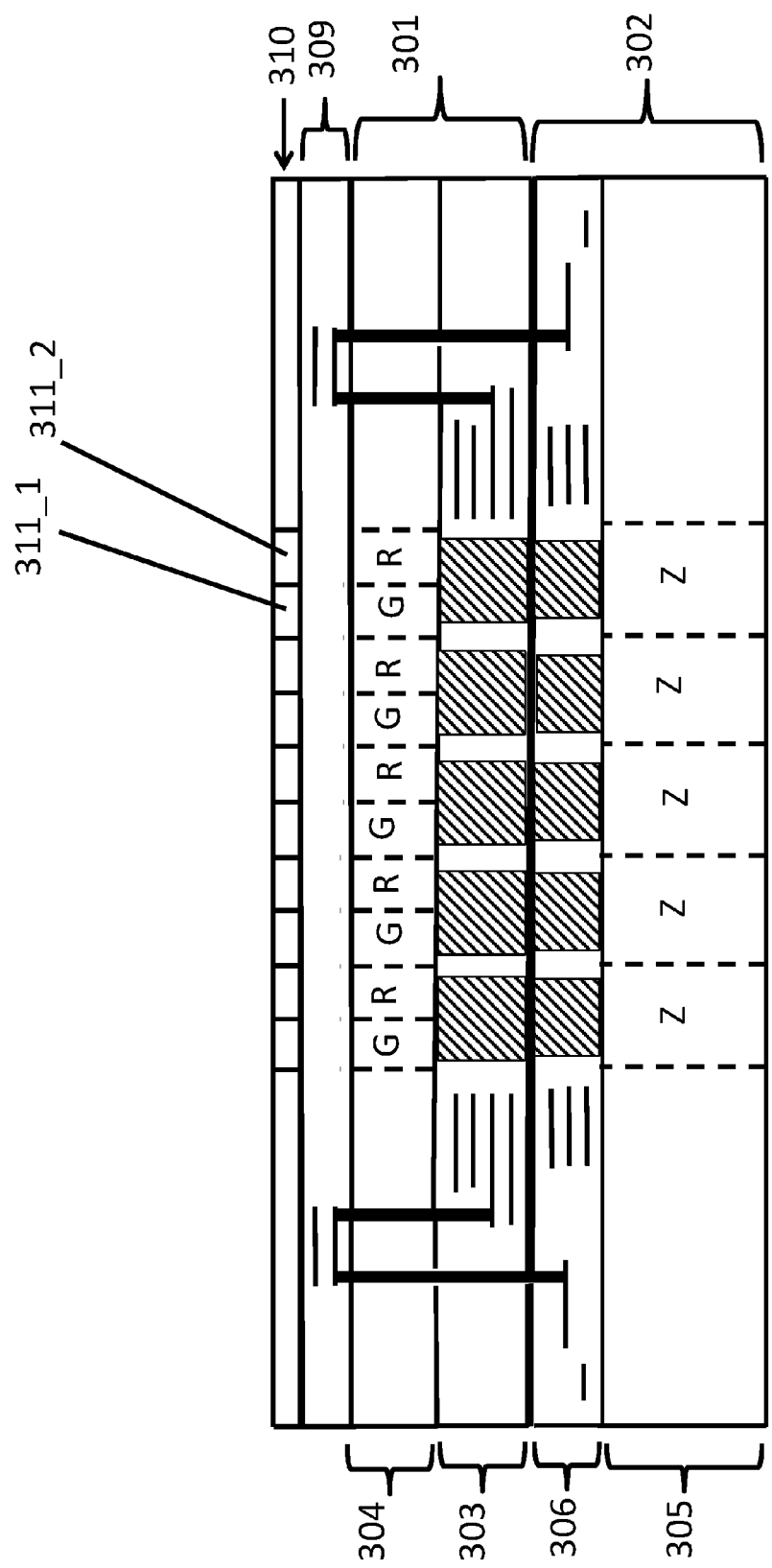

FIG. 3*f* shows the formation of a filtering layer 310 over the backside metallization layering 310. The filtering layer may be formed by forming a mordent or transparent layer over the surface of the backside metallization layering 310. Then, visible light filters of a first type 311_1 (e.g., a green colored "G" filter) are formed in the mordent or transparent layer by dying the layer the appropriate color (G) in the appropriate region. The dying may be implemented by heat transferring a mordent dye through a photoresist mask into a mordent layer and then stripping the mask, or, imbibing a dye into a transparent layer through a photoresist mask and then stripping the mask. Here, the photoresist and masking is patterned so as to expose the regions of interest (the G pixel regions) and block out the other others regions (the R and B regions). The process then repeats for the other regions and colors as appropriate (e.g., R region 311_2 and B region (not shown in FIG. 3*f*)).

Figure 3G:
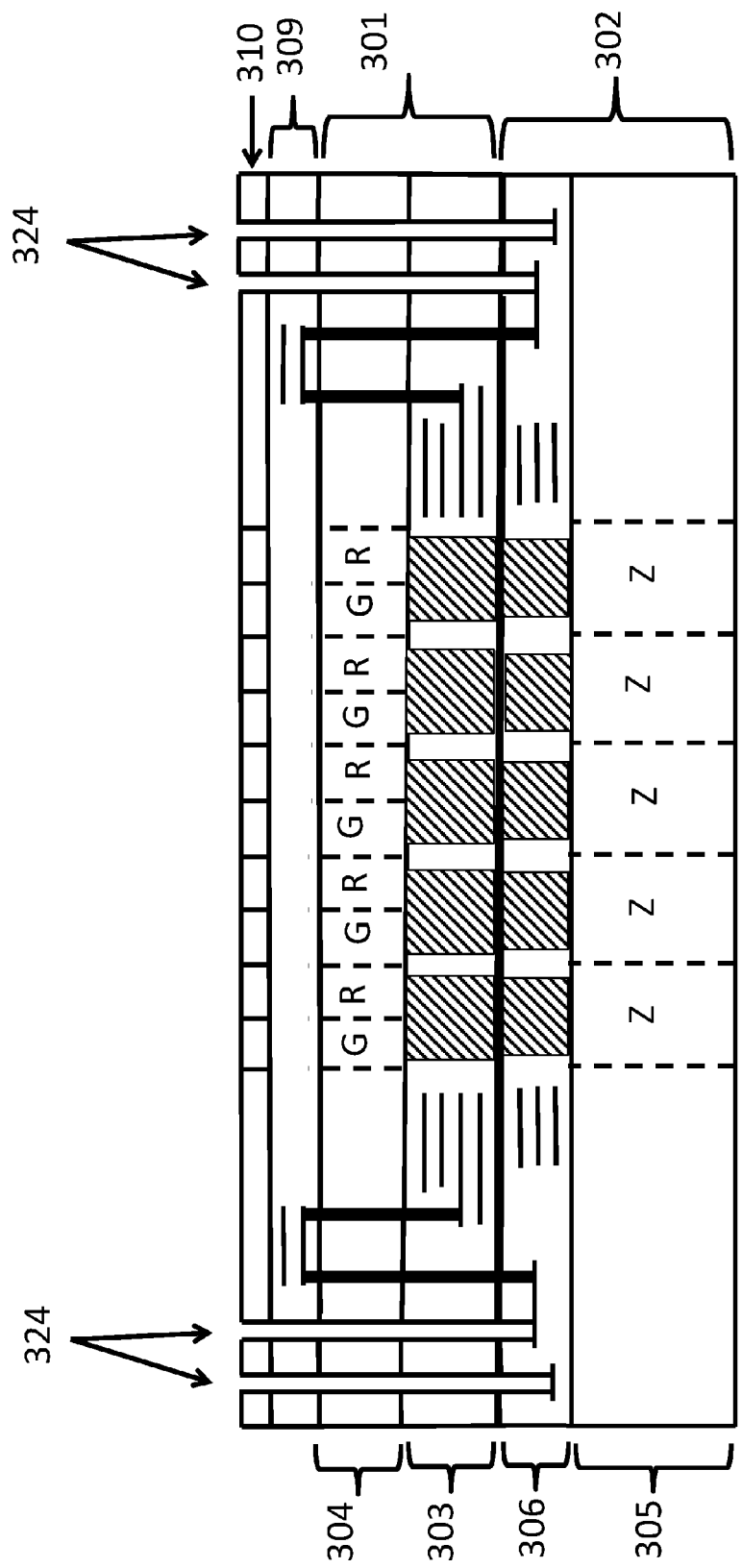

As observed in FIG. 3*g* the filtering layer 310 is etched to form etched regions 324. The etched regions 324 may all have a same depth or have different depths depending on implementation. Again, individual masking can be used to form different etch depths. As observed in FIG. 3*g*, in an embodiment, at least some of the etch depths extend through the upper pixel array semiconductor substrate 304 and into the front side metallization 306 of the lower pixel array 302. These etched regions, as will become more apparent below, support through substrate vias that connect to I/O bond pads of the stacked RGBZ pixel array. Other etch depths (not shown) may extend only into the backside metallization layering 309 of the upper pixel array 301 so that I/O bond pads may be directly connected to features within this layer.

Figure 3H:
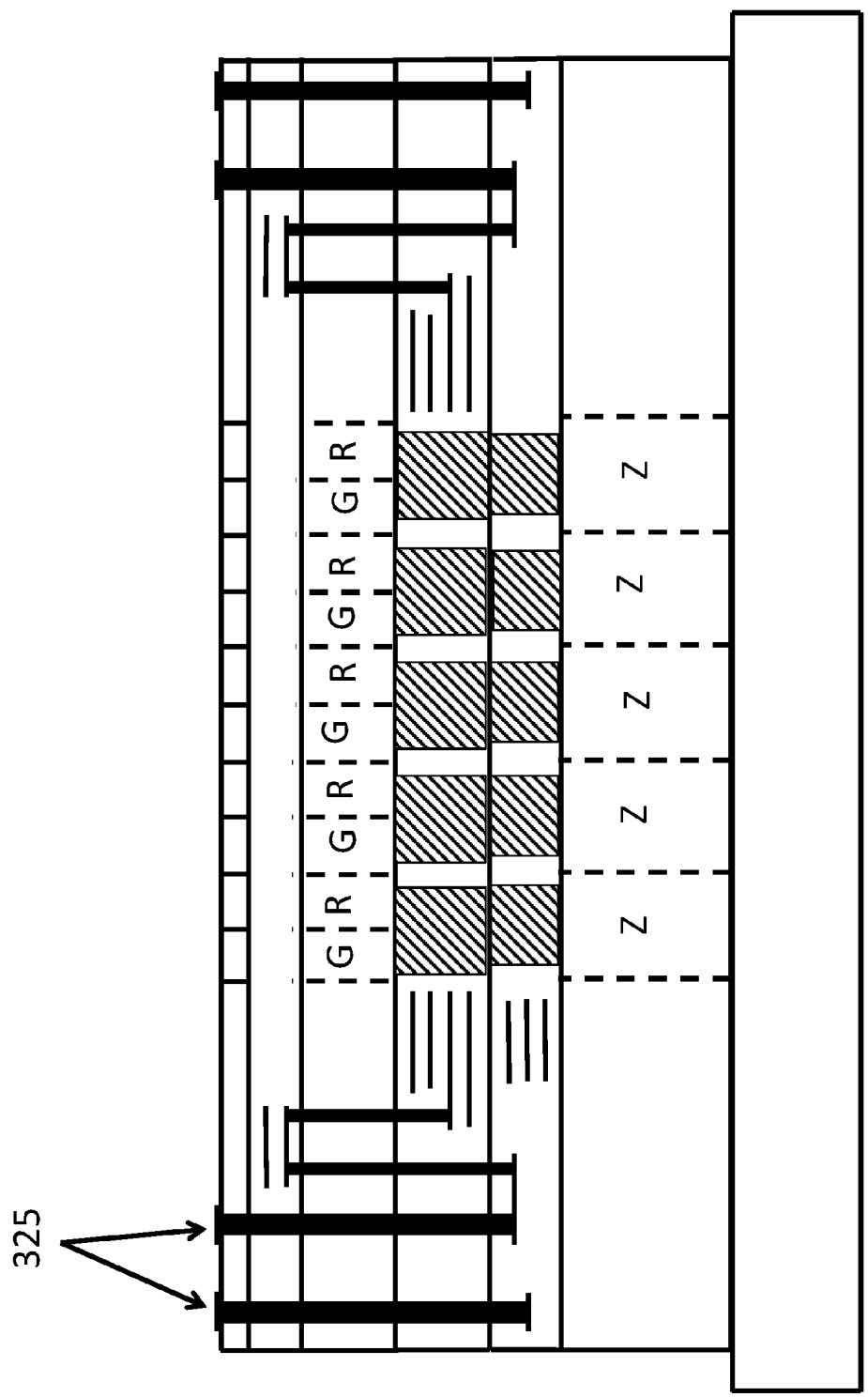

FIG. 3*h* shows the structure after the through substrate vias are formed in the etched regions 324 and bond pads 325 are placed thereon. The vias may be formed similar to the vias of FIG. 3*e*.

Figure 3I:
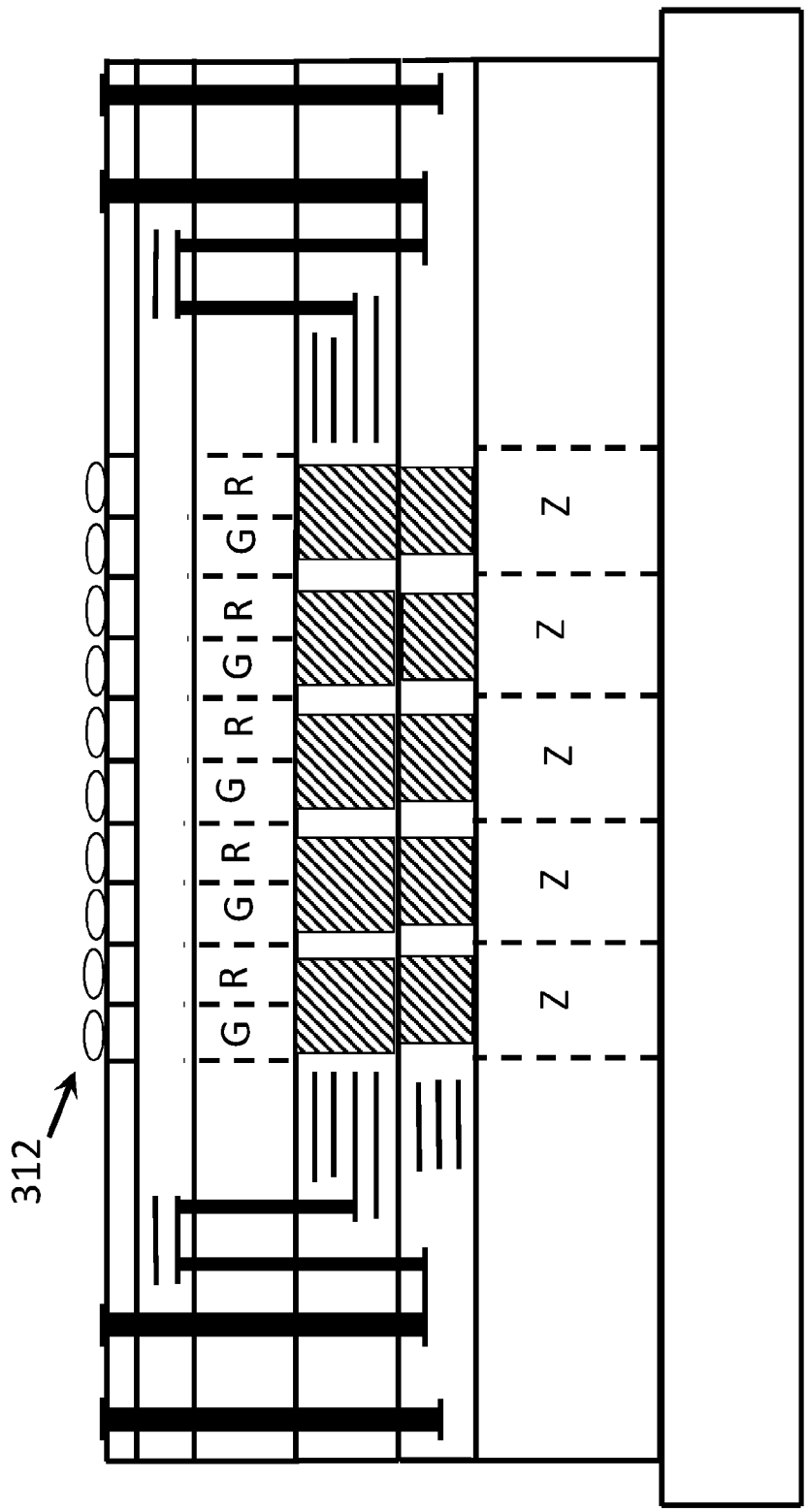

FIG. 3*i* shows the completed stacked RGBZ pixel array after the formation of the micro lens array 312 over the filtering layer 310. The micro-lenses can be formed by any of a number of various processes such as: 1) coating and baking one or more photoresist layers on the underlying structure, patterning the photoresist layers into, e.g., circles/cylinders representing the micro-lens array and then melting the photoresist circles/cylinders into the shape of the micro-lenses; 2) performing the process of 1) above on a layer on a transparent layer (e.g., fused silica) and using the melted photoresist as a mask for a RIE etch into the transparent layer (which completes the form of fuller micro-lenses into the transparent layer); 3) micro-jetting droplets aimed on the underlying structure in the array pattern and solidifying the droplets.

FIGS. 4a through 4d show different possible architectures for the stacked pixel array structure discussed above. Understanding that a spectrum of different architectural possibilities exist, FIG. 4a shows an embodiment toward one end of the spectrum while FIG. 4b shows an embodiment toward another end of the spectrum. The spectrum ends are classified as a function of how much image sensor functionality other than a pixel array is integrated on the stacked semiconductor die structure.

Recalling that transistors may be formed, e.g., on the outer periphery of both pixel arrays, such transistors are generally used to form circuits that perform image sensor functionality. To the extent more image sensor functionality is integrated on one of the dies having an active pixel array, the numbers of such transistors (and the corresponding semiconductor surface area consumed by them) will increase, and, to the extent less image sensor functionality is integrated on a die having an active pixel array the numbers of such transistors (and the corresponding semiconductor surface area consumed by them) will decrease.

As is understood in the art, image sensors can generally be viewed as including not only an active pixel array but also pixel array circuitry, analog-to-digital conversion circuitry and timing and control circuitry. The pixel array circuitry generally includes circuitry that directly communicates to/from the active pixel array itself. Examples include sense amplifiers, row and column address decoders and, in the case of Z pixels for time-of-flight measurements, at least one clock signal per Z pixel for performing the time-of-flight measurement. Analog-to-digital circuitry is responsible for converting the analog signals detected from the incident optical signals to digital values. The timing and control circuitry is responsible for providing the appropriate clocking signals and control signals to the pixel array circuitry and the analog-to-digital converter circuitry.

Toward one end of the spectrum, observed in FIG. 4a, little such functionality is placed on either pixel array die, leaving the bulk of such functionality to be placed on the third, lower substrate which is implemented as a semiconductor chip. Toward the other end of the spectrum, observed in FIG. 4b, large amounts of such functionality are placed on both pixel array dies. In the particular embodiment of FIG. 4b, the upper die corresponds to an entire RGB image sensor and the lower die corresponds to an entire time-of-flight image sensor. In this case, the lower substrate can be implemented as a package substrate.

A large range of architectural possibilities exist between these two spectral end regions. For example, as observed in FIG. 4c, only the pixel array circuitry is implemented on their respective pixel array dies leaving the timing and control circuitry and analog-to-digital circuitry for both image sensors to be implemented on the lowest semiconductor chip die.

As another example, observed in FIG. 4d, the lower pixel array die includes the timing and control circuitry and ADC circuitry for both the upper and the lower pixel arrays. Note that in the case where the lower pixel array die contains circuitry that supports the upper pixel array, the top surface of the lower pixel array should have pads/lands that connect to circuitry internal to the lower pixel array die rather than a through-substrate-via of the lower pixel array die. From FIGS. 4a through 4d, one of ordinary skill will recognize that a wide range of architectural possibilities exist where the various circuits for the pair of image sensors, or portions thereof, may potentially reside on any of the upper pixel array die, the lower pixel array die and the lower substrate semiconductor chip (if any).

Figure 5:
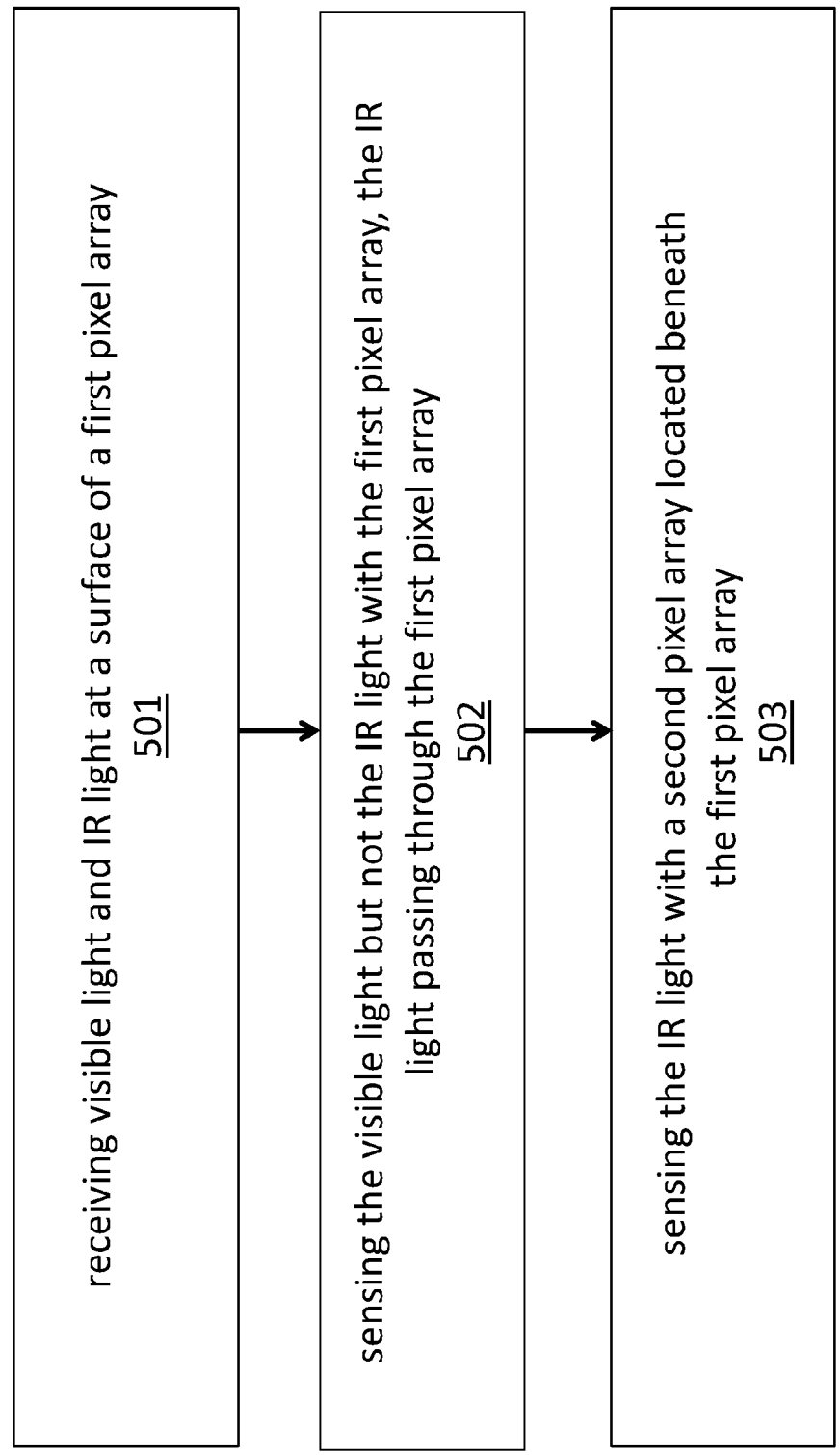
FIG. 5 shows a method performed by a stacked semiconductor chip RGBZ sensor.

FIG. 5 shows a method performed by the RGBZ image sensor embodiments discussed above. As observed in FIG. 5 incident visible light and incident IR light are received at a surface of a first pixel array 501. The visible light but not the IR light is sensed with the first pixel and the IR light passes through the first pixel array 502. The IR light is sensed with a second pixel array located beneath the first pixel array 503.

Figure 6:
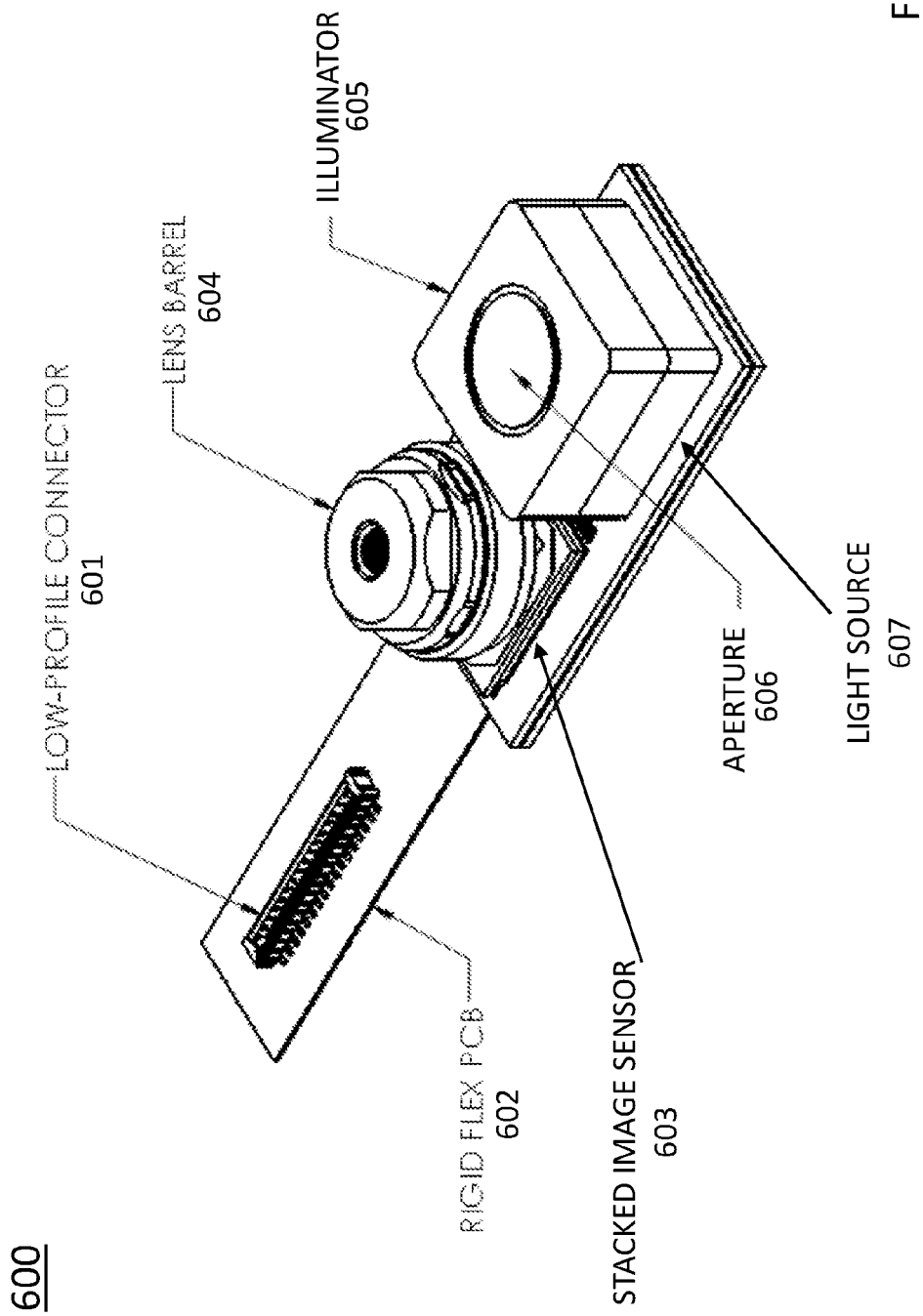
FIG. 6 shows an embodiment of a 2D/3D camera system.

FIG. 6 shows an integrated traditional camera and time-of-flight imaging system 600. The system 600 has a connector 601 for making electrical contact, e.g., with a larger system/mother board, such as the system/mother board of a laptop computer, tablet computer or smartphone. Depending on layout and implementation, the connector 601 may connect to a flex cable that, e.g., makes actual connection to the system/mother board, or, the connector 601 may make contact to the system/mother board directly.

The connector 601 is affixed to a planar board 602 that may be implemented as a multi-layered structure of alternating conductive and insulating layers where the conductive layers are patterned to form electronic traces that support the internal electrical connections of the system 600. Through the connector 601 commands are received from the larger host system such as configuration commands that write/read configuration information to/from configuration registers within the camera system 600.

An "RGBZ" image sensor composed of an RGB pixel array implemented on a first semiconductor die that is stacked on a second semiconductor die having IR pixels to, e.g., implement time-of-flight pixels are within a semiconductor chip package 603 that is mounted to the planar board 602. The stacked RGBZ image sensor includes an upper RGB pixel array having different kinds of pixels that are sensitive to visible light (specifically, a subset of R pixels that are sensitive to visible red light, a subset of G pixels that are sensitive to visible green light and a subset of B pixels that are sensitive to blue light). A lower Z pixel array has pixels that are sensitive to IR light. The RGB pixels are used to support traditional "2D" visible image capture (traditional picture taking) functions. The IR sensitive pixels are used to support 3D depth profile imaging using time-of-flight techniques. Although a basic embodiment includes RGB pixels for the visible image capture, other embodiments may use different colored pixel schemes (e.g., Cyan, Magenta and Yellow). The RGBZ image sensor may also include ADC circuitry and timing and control circuitry for both pixel arrays.

The planar board 602 may likewise include signal traces to carry digital information provided by the ADC circuitry to the connector 601 for processing by a higher end component of the computing system, such as an image signal processing pipeline (e.g., that is integrated on an applications processor). Note that in other embodiments an image signal processing pipeline or at least some form of digital signal processing performed on the ADC output pixel stream may be performed with digital logic circuitry on a semiconductor chip that is integrated into the camera system 600.

A camera lens module 604 is integrated above the pixel arrays of the RGBZ image sensor 603. The camera module 604 contains a system of one or more lenses to focus light received through an aperture of the RGBZ image sensor package 603.

An illuminator 607 composed of a light source array beneath an aperture 606 is also mounted on the planar board

602. The light source array may be implemented as an array of vertical cavity side emitting lasers (VCSELs) or light emitting diodes (LEDs) implemented on a semiconductor chip that is mounted to the planar board 601. Alternatively, a single light source may be used (e.g. a single VCSEL or LED as opposed to an array). A light source driver is coupled to the light source array to cause it to emit light with a particular intensity and modulated waveform.

In an embodiment, the integrated system 600 of FIG. 6 supports three modes of operation: 1) 2D mode; 3) 3D mode; and, 3) 2D/3D mode. In the case of 2D mode, the system behaves as a traditional camera. As such, illuminator 607 is disabled and the image sensor is used to receive visible images through its RGB pixels. In the case of 3D mode, the system is capturing time-of-flight depth information of an object in the field of view of the illuminator 607 and the camera lens module 604. As such, the illuminator is enabled and emitting IR light (e.g., in an on-off-on-off . . . sequence) onto the object. The IR light is reflected from the object, received through the camera lens module 604 and sensed by the image sensor's time-of-flight pixels. In the case of 2D/3D mode, both the 2D and 3D modes described above are concurrently active.

Figure 7:
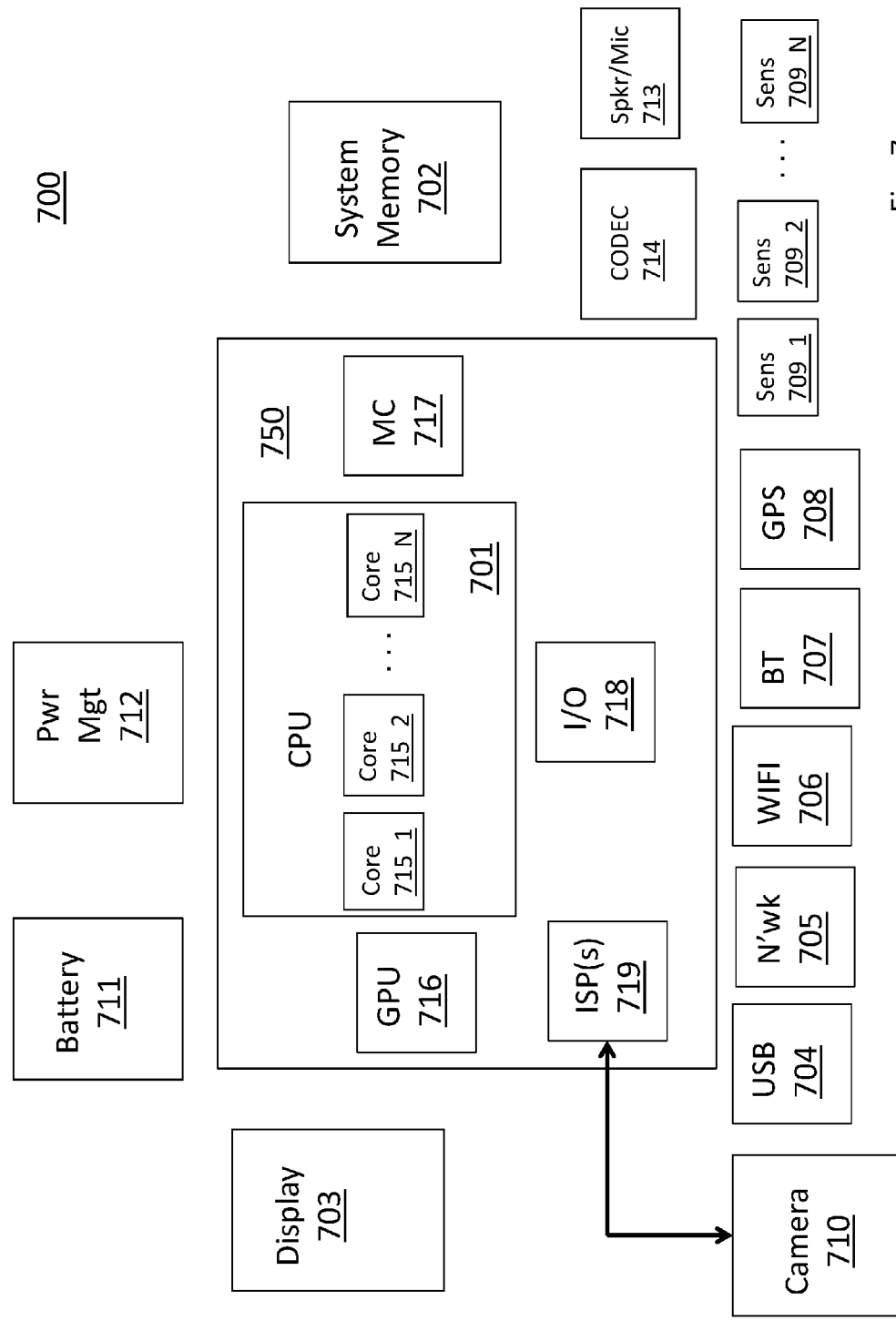
FIG. 7 shows an embodiment of a computing system having a 2D/3D camera system.

FIG. 7 shows a depiction of an exemplary computing system 700 such as a personal computing system (e.g., desktop or laptop) or a mobile or handheld computing system such as a tablet device or smartphone. As observed in FIG. 7, the basic computing system may include a central processing unit 701 (which may include, e.g., a plurality of general purpose processing cores) and a main memory controller 717 disposed on an applications processor or multi-core processor 750, system memory 702, a display 703 (e.g., touchscreen, flat-panel), a local wired point-to-point link (e.g., USB) interface 704, various network I/O functions 705 (such as an Ethernet interface and/or cellular modem subsystem), a wireless local area network (e.g., WiFi) interface 706, a wireless point-to-point link (e.g., Bluetooth) interface 707 and a Global Positioning System interface 708, various sensors 709_1 through 709_N, one or more cameras 710, a battery 711, a power management control unit 712, a speaker and microphone 713 and an audio coder/decoder 714.

An applications processor or multi-core processor 750 may include one or more general purpose processing cores 715 within its CPU 401, one or more graphical processing units 716, a main memory controller 717, an I/O control function 718 and one or more image signal processor pipelines 719. The general purpose processing cores 715 typically execute the operating system and application software of the computing system. The graphics processing units 716 typically execute graphics intensive functions to, e.g., generate graphics information that is presented on the display 703. The memory control function 717 interfaces with the system memory 702. The image signal processing pipelines 719 receive image information from the camera and process the raw image information for downstream uses. The power management control unit 712 generally controls the power consumption of the system 700.

Each of the touchscreen display 703, the communication interfaces 704-707, the GPS interface 708, the sensors 709, the camera 710, and the speaker/microphone codec 713, 714 all can be viewed as various forms of I/O (input and/or output) relative to the overall computing system including, where appropriate, an integrated peripheral device as well (e.g., the one or more cameras 710). Depending on implementation, various ones of these I/O components may be integrated on the applications processor/multi-core processor 750 or may be located off the die or outside the package of the applications processor/multi-core processor 750.

In an embodiment one or more cameras 710 includes an integrated traditional visible image capture and time-of-flight depth measurement system such as the system 600 described above with respect to FIG. 6. Application software, operating system software, device driver software and/or firmware executing on a general purpose CPU core (or other functional block having an instruction execution pipeline to execute program code) of an applications processor or other processor may direct commands to and receive image data from the camera system. In the case of commands, the commands may include entrance into or exit from any of the 2D, 3D or 2D/3D system states discussed above.

Embodiments of the invention may include various processes as set forth above. The processes may be embodied in machine-executable instructions. The instructions can be used to cause a general-purpose or special-purpose processor to perform certain processes. Alternatively, these processes may be performed by specific hardware components that contain hardwired logic for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. A method comprising:
    forming a backside illumination pixel array including (i) pixels of a first type, and, (ii) for each pixel, a light guide structure between the pixel and a front side surface of the backside illumination pixel array;
    forming a front side illumination pixel array including (i) pixels of a second type, and, (ii) for each pixel, a light guide structure between the pixel and a front side surface of the front side pixel array; and
    stacking the backside illumination pixel array on the front side illumination pixel array.

2. The method of claim 1, wherein:
    the pixels of the first type comprise visible light sensitive pixels, and
    the pixels of the second type comprise infrared light sensitive pixels.

3. The method of claim 1, wherein the pixels of the second type are larger than the pixels of the first type.

4. The method of claim 1, comprising coupling corresponding light guide structures of the backside illumination pixel array and the front side illumination pixel array to allow incident light that passes through the pixels of the first type in the backside illumination pixel array to flow to the pixels of the second type in the front side pixel array.

5. The method of claim 1, wherein the pixels of the first type absorb light of the first type and allow light of the second type to pass through.

6. The method of claim 1, wherein the front side illumination pixel array is formed to be thicker than the backside illumination pixel array.

7. The method of claim 1, wherein forming the backside illumination pixel array comprises:
    forming a semiconductor die layer; and
    forming a front side metallization layer.

8. The method of claim 1, wherein forming the front side illumination pixel array comprises:
    forming a semiconductor die layer; and
    forming an interconnect metallization layer.

9. The method of claim 1, wherein forming the backside illumination pixel array comprises:
    depositing conductive traces in an area around the pixels rather than over the pixels themselves.

10. The method of claim 1, wherein forming the backside illumination pixel array comprises etching the light guide structure through stacked dielectric layers dispose over the pixels to form trenches.

11. The method of claim 10, wherein forming the backside illumination pixel array comprises filling the trenches with a material that includes a high index of refraction and that is transparent to infrared light.

12. The method of claim 1, wherein forming the backside illumination pixel array comprises etching an annulus structure around a periphery of the light guide structure to form an etched region or air gap.

13. The method of claim 12, wherein forming the backside illumination pixel array comprises filling the etched region with metal.

14. The method of claim 1, wherein stacking the backside illumination pixel array on the front side illumination pixel array comprises affixing the backside illumination pixel array to the front side illumination pixel array using a wafer-on-wafer semiconductor chip attach process.

15. The method of claim 1, wherein stacking the backside illumination pixel array on the front side illumination pixel array comprises affixing the backside illumination pixel array to the front side illumination pixel array using a die-on-die semiconductor chip attach process.

16. The method of claim 1, comprising, after the backside illumination pixel array is stacked on the front side illumination pixel array, etching the stacked pixel arrays at different depths, to form etched regions.

17. The method of claim 16, wherein the stacked pixel arrays are etched using a reactive iron etch.

18. The method of claim 16, wherein the stacked pixel arrays are etched using a deep reactive iron etch.

19. The method of claim 16, comprising filling the etched regions with a conductive materials.

20. The method of claim 1, comprising, after the backside illumination pixel array is stacked on the front side illumination pixel array, forming a filtering layer over the backside illumination pixel array.

* * * * *